US010256159B2

United States Patent
Bao et al.

(10) Patent No.: US 10,256,159 B2
(45) Date of Patent: Apr. 9, 2019

(54) FORMATION OF COMMON INTERFACIAL LAYER ON SI/SIGE DUAL CHANNEL COMPLEMENTARY METAL OXIDE SEMICONDUCTOR DEVICE

(71) Applicant: INTERNATIONAL BUSINESS MACHINES CORPORATION, Armonk, NY (US)

(72) Inventors: Ruqiang Bao, Wappingers Falls, NY (US); Hemanth Jagannathan, Niskayuna, NY (US); ChoongHyun Lee, Rensselaer, NY (US); Shogo Mochizuki, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 15/412,499

(22) Filed: Jan. 23, 2017

(65) Prior Publication Data
US 2018/0211885 A1     Jul. 26, 2018

(51) Int. Cl.
*H01L 21/8238*   (2006.01)
*H01L 27/092*    (2006.01)
*H01L 21/311*    (2006.01)

(52) U.S. Cl.
CPC ......... *H01L 21/823857* (2013.01); *H01L 21/31122* (2013.01); *H01L 27/092* (2013.01)

(58) Field of Classification Search
CPC ....... H01L 21/823857; H01L 21/31122; H01L 27/092
See application file for complete search history.

(56) References Cited

U.S. PATENT DOCUMENTS

| | | | |
|---|---|---|---|
| 5,403,434 A | * | 4/1995 | Moslehi ............ H01L 21/02046 134/1 |
| 7,186,600 B2 | | 3/2007 | Ohtani et al. |
| 7,282,398 B2 | | 10/2007 | Yamazaki et al. |
| 7,495,313 B2 | | 2/2009 | Nayfeh et al. |

(Continued)

OTHER PUBLICATIONS

Kepa et al., "Comparative analysis of thermally induced degradation of condensation-grown (100) Ge0.75Si0.25/SiO2 interfaces", Applied Surface Science. vol. 291. Feb. 1, 2014. pp. 20-24.

(Continued)

*Primary Examiner* — Yosef Gebreyesus
(74) *Attorney, Agent, or Firm* — Tutunjian & Bitetto, P.C.; Vazken Alexanian

(57) ABSTRACT

A method is presented for forming a semiconductor structure. The method includes forming a silicon (Si) channel for a first device, forming a first interfacial layer over the Si channel, forming a silicon-germanium (SiGe) channel for a second device, forming a second interfacial layer over the SiGe channel, and selectively removing germanium oxide ($GeO_x$) from the second interfacial layer by applying a combination of hydrogen ($H_2$) and hydrogen chloride (HCl). The second interfacial is silicon germanium oxide ($SiGeO_x$) and removal of the $GeO_x$ results in formation of a pure silicon dioxide ($SiO_2$) layer.

10 Claims, 6 Drawing Sheets

(56) References Cited

U.S. PATENT DOCUMENTS

| | | | |
|---|---|---|---|
| 8,952,460 B2 | 2/2015 | Brodsky et al. | |
| 9,105,745 B2 | 8/2015 | Ando et al. | |
| 2005/0280104 A1* | 12/2005 | Li | H01L 21/823857 257/406 |
| 2010/0109044 A1* | 5/2010 | Tekleab | H01L 21/823807 257/190 |
| 2010/0181626 A1* | 7/2010 | Lin | H01L 21/823807 257/369 |
| 2010/0200897 A1 | 8/2010 | Heringa et al. | |
| 2013/0034940 A1* | 2/2013 | Ando | H01L 21/823807 438/199 |
| 2013/0126986 A1* | 5/2013 | Brodsky | H01L 21/28255 257/411 |
| 2014/0273412 A1 | 9/2014 | Wu et al. | |
| 2014/0342575 A1 | 11/2014 | Ito et al. | |

OTHER PUBLICATIONS

Wang et al., "Desorption kinetics of GeO from GeO2/Ge structure", Journal of Applied Physics. vol. 108. Sep. 7, 2010. pp. 1-8.

Jagannathan et al, "Silicon-Germanium Semiconductor Devices and Method of Making", U.S. Appl. No. 14/976,522, filed Dec. 21, 2016. pp. 1-19.

* cited by examiner

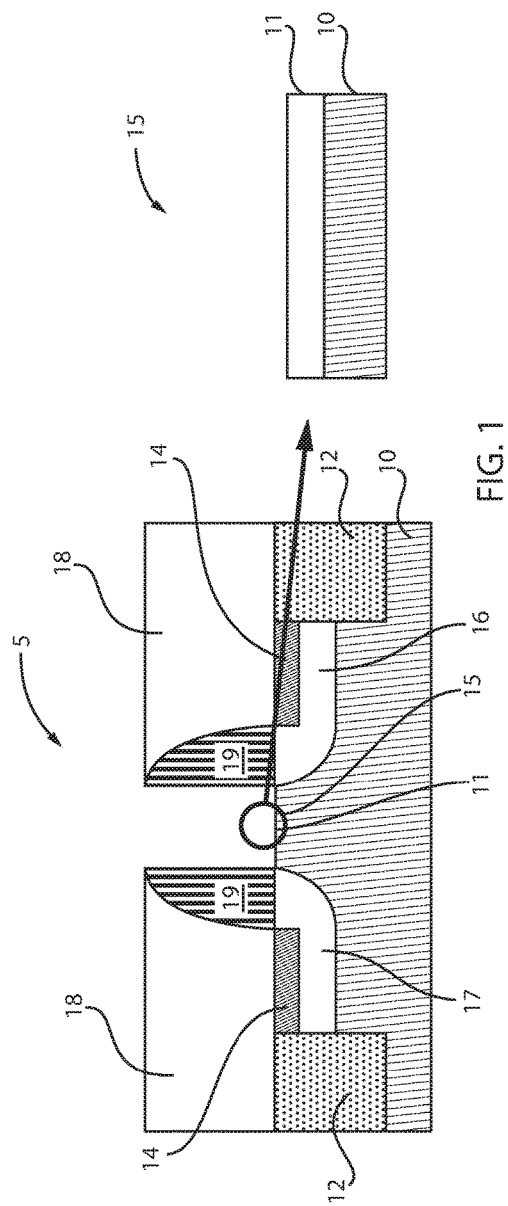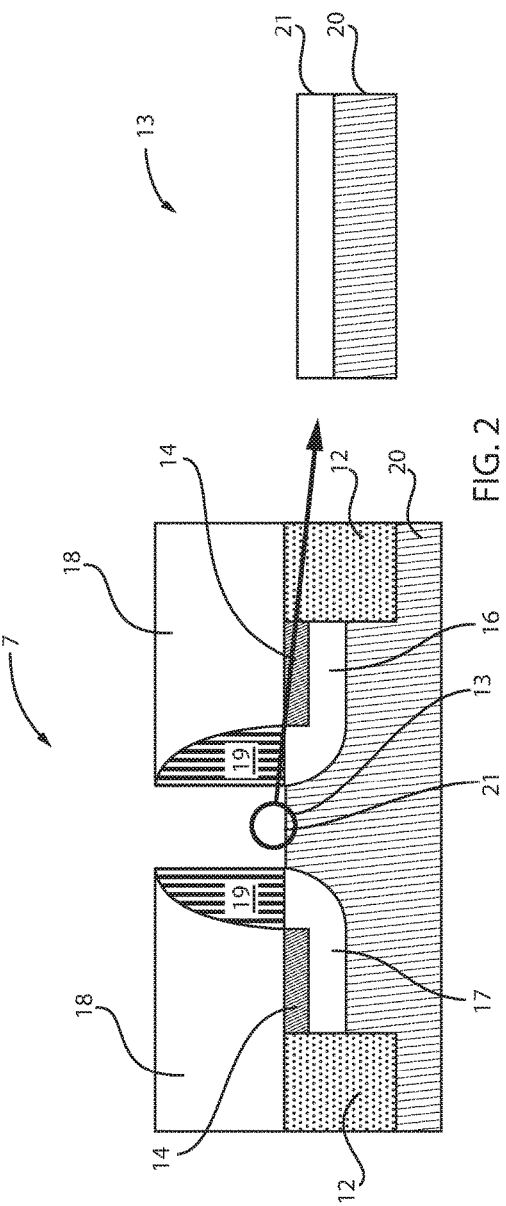

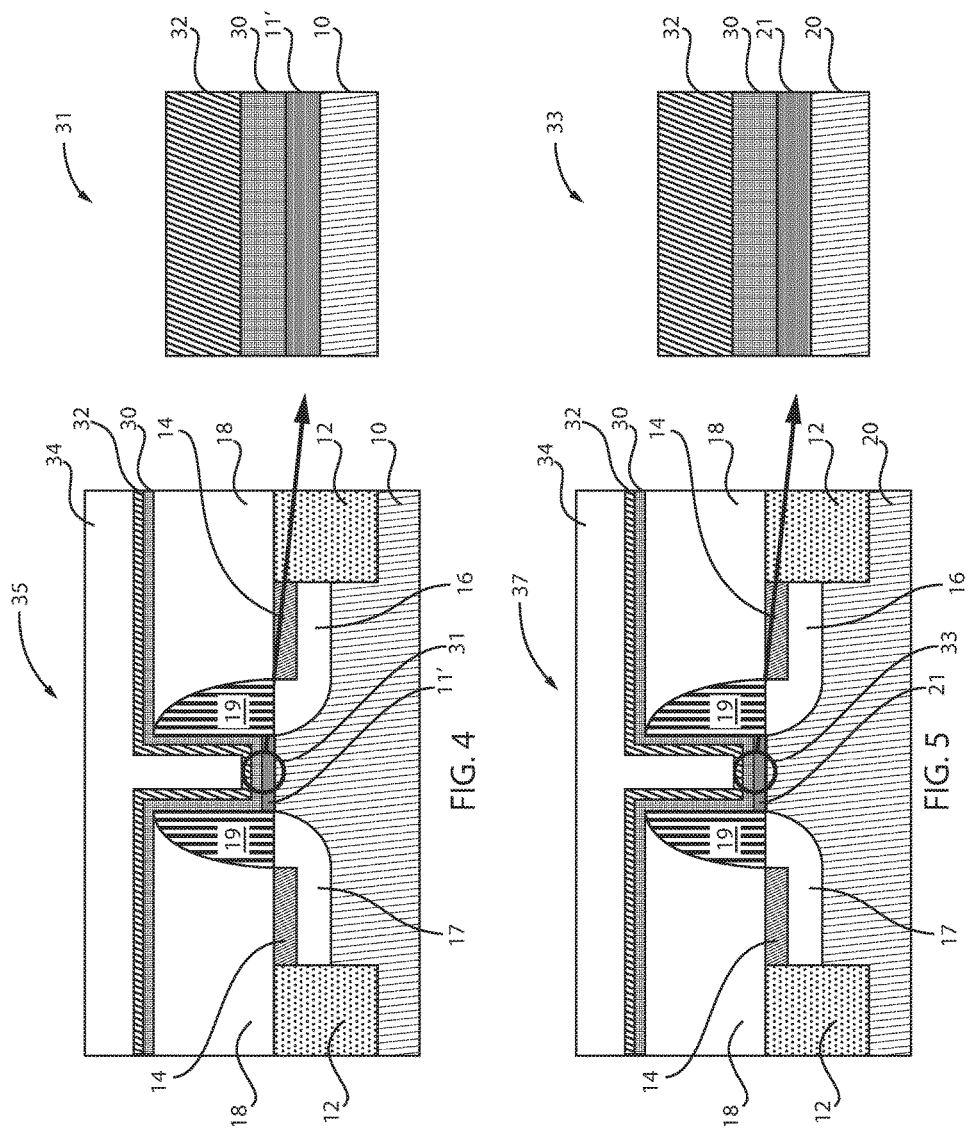

FORMATION OF COMMON INTERFACIAL LAYER ON SI/SIGE DUAL CHANNEL COMPLEMENTARY METAL OXIDE SEMICONDUCTOR DEVICE

BACKGROUND

Technical Field

The present invention relates generally to semiconductor devices, and more specifically, to the formation of a common interfacial layer in Si/SiGe dual channel complementary metal oxide semiconductor (CMOS) devices.

Description of the Related Art

Present day integrated circuits (ICs) are implemented by using a plurality of interconnected field effect transistors (FETs), also called metal oxide semiconductor field effect transistors (MOSFETs). A FET includes a gate electrode structure as a control electrode and spaced apart source and drain electrodes between which a current can flow. A control voltage applied to the gate electrode structure controls the flow of current through a channel region between the source and drain electrodes.

A compressive longitudinal stress can be applied to the channel region of a FET by embedding an expanding material such as silicon germanium (SiGe) formed by a selective epitaxial growth process in the silicon (Si) substrate at the ends of the transistor channel region. A SiGe crystal has a greater lattice constant than the lattice constant of a Si crystal, and consequently the presence of embedded SiGe causes a deformation of the Si matrix that, in turn, compresses the material in the channel region.

SUMMARY

In accordance with an embodiment, a method is provided for forming a semiconductor structure. The method includes forming a silicon (Si) channel for a first device, forming a first interfacial layer over the Si channel, forming a silicon-germanium (SiGe) channel for a second device, forming a second interfacial layer over the SiGe channel, and selectively removing germanium oxide ($GeO_X$) from the second interfacial layer by applying a combination of hydrogen ($H_2$) and hydrogen chloride (HCl).

In accordance with another embodiment, a semiconductor device is provided. The semiconductor device includes a silicon (Si) channel formed for a first device, a first interfacial layer formed over the Si channel, a silicon-germanium (SiGe) channel formed for a second device, and a second interfacial layer formed over the SiGe channel. The germanium oxide ($GeO_X$) is selectively removed from the second interfacial layer by applying a combination of hydrogen ($H_2$) and hydrogen chloride (HCl).

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein:

FIG. 1 is a cross-sectional view of a semiconductor structure including a silicon germanium (SiGe) channel with silicon germanium oxide ($SiGeO_X$) formed thereon by ozonated water, in accordance with an embodiment of the present invention;

FIG. 2 is a cross-sectional view of a semiconductor structure including a silicon (Si) channel with silicon oxide ($SiO_X$) formed thereon by ozonated water, in accordance with an embodiment of the present invention;

FIG. 4 is a cross-sectional view of the semiconductor device of FIG. 3 where a high-k metal gate (HKMG) is applied, in accordance with an embodiment of the present invention;

FIG. 5 is a cross-sectional view of the semiconductor device of FIG. 2 where a high-k metal gate (HKMG) is applied, in accordance with an embodiment of the present invention;

Throughout the drawings, same or similar reference numerals represent the same or similar elements.

DETAILED DESCRIPTION

Figure 3:
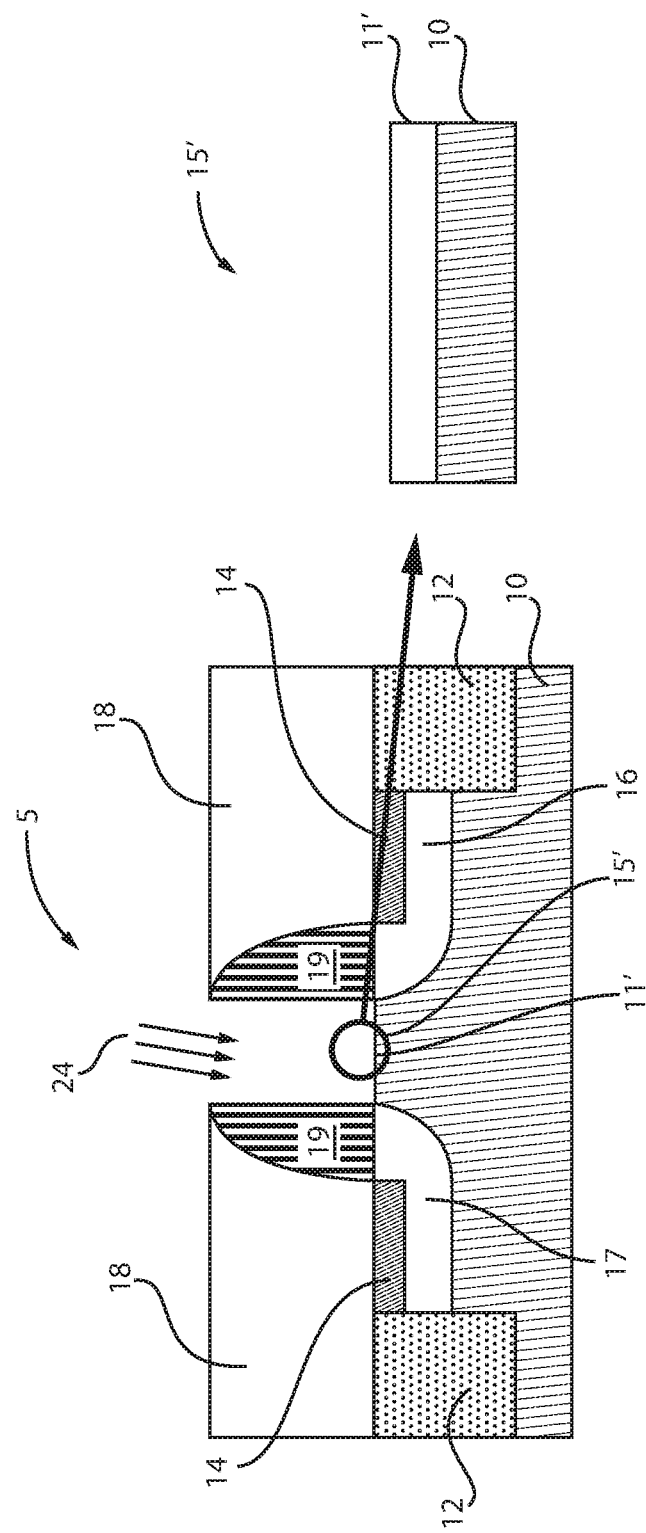
FIG. 3 is a cross-sectional view of the semiconductor device of FIG. 1 where germanium oxide ($GeO_X$) is selectively removed from the $SiGeO_X$, in accordance with an embodiment of the present invention.

Embodiments of the present invention relate generally to a method for forming a semiconductor structure. The method includes forming a silicon (Si) channel for a first device, forming a first interfacial layer over the Si channel, forming a silicon-germanium (SiGe) channel for a second device, forming a second interfacial layer over the SiGe channel, and selectively removing germanium oxide ($GeO_X$) from the second interfacial layer by applying a combination of hydrogen ($H_2$) and hydrogen chloride (HCl).

Moreover, embodiments of the present invention relate generally to a semiconductor device. The semiconductor device includes a silicon (Si) channel formed for a first device, a first interfacial layer formed over the Si channel, a silicon-germanium (SiGe) channel formed for a second device, and a second interfacial layer formed over the SiGe channel. The germanium oxide ($GeO_X$) is selectively removed from the second interfacial layer by applying a combination of hydrogen ($H_2$) and hydrogen chloride (HCl).

In one or more embodiments, $H_2$ and HCl gases are used to selectively remove GeOx components in an interfacial layer (IL) formed on the SiGe channel in a replacement metal gate (RMG) module. The process of the present invention can selectively remove GeOx without breaking Si—O bonds in the IL at a relatively lower temperature, thus resulting in pure $SiO_2$ IL formed on the SiGe channel devices over a wide range of Ge content. The exemplary embodiments of the present invention also provide for lower interface trap density and better hole mobility in SiGe pFETs.

In one or more embodiments, in the RMG module of the Si/SiGe dual channel integration, a dummy gate and dummy oxide are completely removed. Additionally, after pre-cleaning of the Si/SiGe surface, the IL is formed by chemical oxidation at the same time. The IL formed on the SiGe surface is comprised of SiOx and GeOx, while the Si surface has a pure $SiO_2$ IL. Selective GeOx removal from SiGeOx IL formed on the SiGe surface is carried out in $H_2$ and HCl ambient at a low temperature. Since the Ge—O (GeOx) bond is much weaker than Si—O (SiOx), selective GeOx removal occurs. High-k and metal gate (HKMG) are deposited on the top of the IL. Moreover, the Si and SiGe channels have the same HKMG stack due to selective GeOx removal from SiGeOx IL on the SiGe surface.

In one or more embodiments, to improve the SiGe gate stack, the selective removal of the GeOx component from the IL formed on the SiGe channel is required. The pFET channel is SiGe, a pure $SiO_2$ IL formation takes place in the RMG, SiGeOx IL is formed by deionized ozone treatment, thermal treatment on SiGeOx IL takes place via $H_2$ and HCl gases, the $GeO_X$ component is selectively removed, thus resulting in pure $SiO_2$, and improvement of the SiGe gate stack is confirmed by electrical measurement.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A "gate structure" means a structure used to control output current (i.e., flow of carriers in the channel) of a semiconducting device through electrical or magnetic fields.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, the terms "insulating" and "dielectric" denote a material having a room temperature conductivity of less than about $10^{-10}$ $(\Omega\text{-m})^{-1}$.

As used herein, the term "silicide" is an alloy of a metal and silicon.

As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE).

Reactive ion etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation.

The term "processing" as used herein includes deposition of material or photoresist, patterning, exposure, development, etching, cleaning, stripping, implanting, doping, stressing, layering, and/or removal of the material or photoresist as required in forming a described structure.

The terms "gas" and "gases" are used interchangeably, unless otherwise noted, and refer to one or more precursors, reactants, catalysts, carrier, purge, cleaning, combinations thereof, as well as any other fluid introduced into the chamber body.

The semiconductor devices described herein can be any type of device. Exemplary types of semiconductor devices include planar field effect transistors (FETs), fin-type field effect transistors (FinFETs), nanowire/nanosheet devices, vertical field effect transistors (VFETs), or other devices.

It is to be understood that the present invention will be described in terms of a given illustrative architecture; however, other architectures, structures, substrate materials and process features and steps/blocks can be varied within the scope of the present invention. It should be noted that certain features may not be shown in all figures for the sake of clarity. This is not intended to be interpreted as a limitation of any particular embodiment, or illustration, or scope of the claims.

FIG. 1 is a cross-sectional view of a semiconductor structure including a silicon germanium (SiGe) channel with silicon germanium oxide ($SiGeO_X$) formed thereon by ozonated water, in accordance with an embodiment of the present invention.

A semiconductor structure 5 includes a semiconductor substrate 10. Shallow trench isolation (STI) regions 12 are formed on the substrate 10. The STI regions 12 can be formed on opposed ends of the substrate 10. A source 17 and drain 16 are also formed adjacent the STI regions 12. Silicide regions 14 are further formed within the source 17 and drain 16. The silicide regions 14 can contact the STI regions 12. Spacers 19 can be formed over a portion of the source 17 and drain 16. An inter-level dielectric (ILD) 18 is formed adjacent the spacers 19. ILD 18 is positioned directly over the silicide 14 and the STI 12. The highlighted region 15 illustrates a $SiGeO_X$ layer 11 formed over the substrate 10 between the spacers 19. The $SiGeO_X$ layer 11 can be formed by, e.g., ozonated water.

The substrate 10 can be silicon germanium (SiGe). The silicon-germanium substrate can be formed as a layer on another supporting substrate. For example, a layer of silicon germanium can be formed on a silicon substrate or wafer. The supporting substrate can also include one or more semiconductor materials.

Non-limiting examples of suitable supporting substrate materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

The supporting substrate can be a silicon-germanium on insulator substrate (SGOI) with one or more buried dielectric layers. The buried dielectric layers can include, for example, a dielectric material such as silicon dioxide.

The silicon-germanium layer can be formed on the supporting substrate by, for example, depositing one or more layers of germanium and/or silicon onto the silicon substrate. An epitaxial growth process is performed to deposit a crystalline layer onto a crystalline substrate beneath. Epitaxial layers can be grown from gaseous or liquid precursors.

The epitaxial silicon, epitaxial germanium, and epitaxial silicon germanium can be doped during deposition by adding a dopant or impurity. The dopant can be an n-type dopant (e.g., phosphorus or arsenic) or a p-type dopant (e.g., boron or gallium), depending on the type of transistor.

The epitaxial layers can be grown using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

A number of different sources can be used for the deposition of the silicon germanium layer. In some embodiments, the gas source for the deposition of epitaxial silicon germanium includes a silicon containing gas source, a germanium containing gas source, or a combination thereof.

For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

After depositing the one or more layers of silicon, germanium, or silicon germanium, a thermal mixing process can be performed to form the final desired silicon germanium layer or silicon germanium substrate.

The germanium content of the silicon-germanium substrate can generally vary. The substrate can have an atomic germanium content of from about 25% to about 75% according to some embodiments. In another embodiment, the atomic germanium content can be, e.g., up to about 95%, or from about 75% to about 95%.

The silicon-germanium substrate can have a constant atomic germanium content in a given layer. Alternatively, the silicon-germanium substrate can have an increasing atomic gradient of germanium content.

The shallow trench isolation (STI) regions 12 are formed by etching a trench in the substrate utilizing a conventional dry etching process such as RIE or plasma etching. The trenches can optionally be lined with a conventional liner material, e.g., silicon nitride or silicon oxynitride, and then CVD or another like deposition process is used to fill the trench with silicon oxide or another like STI dielectric material. The STI dielectric can optionally be densified after deposition. A conventional planarization process such as chemical-mechanical polishing (CMP) can optionally be used to provide a planar structure.

In some embodiments, the silicide 14 can form automatically during the deposition of the metal. In such embodiments, the silicide formation can be assisted by raising the substrate temperature above the room temperature. In one example, the substrate temperature is 150° C.

In some embodiments, silicide 14 is formed after the metal deposition by annealing at moderate temperatures. In such embodiments, the annealing time and temperature are kept low enough to avoid out-diffusion of hydrogen from c-Si:H and therefore formation of defects that would compromise active doping. In one example, annealing is performed at, e.g., 150° C. for ½ hour. In another example, annealing is performed at, e.g., 200° C. for 1 minute. In yet another example, annealing is performed at, e.g., 300° C. for 10 seconds.

In some embodiments, the formation of the silicide 14 requires depositing a refractory metal such as Ni or Ti onto the surface of a Si-containing material or wafer. Following deposition, the structure is then subjected to an annealing step using conventional processes such as, but not limited to, rapid thermal annealing. During thermal annealing, the deposited metal reacts with Si forming a metal silicide.

In some embodiments, the ILD 18 is planarized. The ILD 18 can extend to a top surface of the spacers 19. The height of the ILD 18 is approximately equal to the height of the spacers 19.

In various embodiments, the height of the ILD 18 can be reduced by chemical-mechanical polishing (CMP) and/or etching. Therefore, the planarization process can be provided by CMP. Other planarization process can include grinding and polishing.

In one or more embodiments, the ILD 18 can have a thickness in the range of about 3 nm to about 10 nm, or in the range of about 3 nm to about 5 nm.

The ILD 18 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the ILD 18 include any of the aforementioned materials in porous form, or in a form that changes during processing to or from being porous and/or permeable to being non-porous and/or non-permeable.

The spacers 19 can be formed by deposition followed by a directional etch (e.g., RIE). Spacers 19 can be formed along the sidewalls of the ILD 18. For example, spacer material such as a nitride (e.g., silicon nitride) can be deposited in a conventional manner, such as by chemical vapor deposition (CVD) or atomic layer deposition (ALD). Other techniques, which can be suitable for deposition of a nitride layer, include low-pressure CVD (LPCVD) and atmospheric pressure (CVD) (APCVD). Portions of the deposited nitride layer are subsequently etched away in a conventional manner to form the spacers 19. Spacer material can be silicon oxide, silicon oxynitride, silicon nitride, SiBCN, SiOCN, SiOC, or any suitable combination of those materials.

In various embodiments, an in-situ doped source/drain 17, 16 is deposited or formed via epitaxial growth. Depending on how the epitaxial growth develops, it can be necessary to anisotropically etch the epitaxial growth.

The dopant can be provided to the doped region(s) 17, 16 (i.e., source/drain region(s)) by ion implantation, and source/drains formed by annealing the doped region(s) 17, 16. In various embodiments, the doped regions 17, 16 can be n-doped or p-doped.

In various embodiments, the doped regions 17, 16 can be doped in-situ or ex-situ, for example, through ion implantation or thermal diffusion of dopants into the substrate. The dopant of the source can be activated by annealing. Other suitable doping techniques can also be used, including but not limited to, gas phase doping, plasma doping, plasma immersion ion implantation, cluster doping, infusion doping, liquid phase doping, solid phase doping, or combinations thereof.

Forming the source and drain regions 17, 16 can include forming an in situ doped epitaxial semiconductor material over an ETSOI layer. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. In some embodiments, the epitaxial deposition process is a selective deposition method, in which the epitaxial semiconductor material is formed only on semiconductor material deposition surfaces. The epitaxial deposition process will not form epitaxial semiconductor material on dielectric surfaces.

In some embodiments, the epitaxial semiconductor material that provides the source and drain regions 17, 16 can be composed of silicon (Si), germanium (Ge), silicon germanium (SiGe), silicon doped with carbon (Si:C) or a combination thereof. In one example, the p-type source and drain regions are provided by silicon germanium (SiGe) epitaxial semiconductor material. In one embodiment, a number of different sources can be used for the epitaxial deposition of the epitaxial semiconductor material that provides the source and drain regions 17, 16.

Examples of silicon including source gases can include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

Examples of germanium including source gases for epitaxially forming the epitaxial semiconductor material of a germanium containing semiconductor include germane, digermane, halogermane, dichlorogermane, trichlorogermane, tetrachlorogermane and combinations thereof.

Epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from about 550° C. to about 900° C. Although higher temperature typically results in faster deposition, the faster deposition can result in crystal defects and film cracking.

The epitaxial semiconductor material that provides the source and drain regions 17, 16 can be in situ doped to a p-type conductivity or an n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material can introduce p-type dopants to the material being formed during the epitaxial deposition process that includes p-type source gases.

As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. The p-type gas dopant source can include diborane ($B_2H_6$).

As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

FIG. 2 is a cross-sectional view of a semiconductor structure including a silicon (Si) channel with silicon oxide ($SiO_x$) formed thereon by ozonated water, in accordance with an embodiment of the present invention.

A semiconductor structure 7 includes a semiconductor substrate 20. Shallow trench isolation (STI) regions 12 are formed on the substrate 20. The STI regions 12 can be formed on opposed ends of the substrate 20. A source 17 and drain 16 are also formed adjacent the STI regions 12.

Silicide regions 14 are further formed within the source 17 and drain 16. The silicide regions 14 can contact the STI regions 12. Spacers 19 can be formed over a portion of the source 17 and drain 16. An inter-level dielectric (ILD) 18 is formed adjacent the spacers 19. ILD 18 is positioned directly over the silicide 14 and the STI 12. The highlighted region 13 illustrates a $SiO_2$ layer 21 formed over the substrate 20 between the spacers 19. The $SiO_2$ layer 21 can be formed by ozonated water.

In one or more embodiments, the substrates 10, 20 can be a semiconductor or an insulator with an active surface semiconductor layer. The substrates 10, 20 can be crystalline, semi-crystalline, microcrystalline, or amorphous. The substrates 10, 20 can be essentially (i.e., except for contaminants) a single element (e.g., silicon), primarily (i.e., with doping) of a single element, for example, silicon (Si) or germanium (Ge), or the substrates 10, 20 can include a compound, for example, $Al_2O_3$, $SiO_2$, GaAs, SiC, or SiGe. The substrates 10, 20 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrates 10, 20 can also have other layers forming the substrates 10, 20 including high-k oxides and/or nitrides. In one or more embodiments, the substrates 10, 20 can be a silicon wafer. In an embodiment, the substrates 10, 20 are a single crystal silicon wafer. In one embodiment, substrate 10 is SiGe and substrate 20 is Si.

Referring to FIGS. 1 and 2, planar structures 5, 7 are shown for simplicity of demonstration. However, it is contemplated that the exemplary embodiments of the present invention can be applicable to 3D structures, such as, but not limited to, FinFETs, Nanowire FETs, etc. FIG. 1 illustrates a SiGe substrate 10 including a $SiGeO_X$ layer 11 (or IL layer) formed thereon between the spacers 19, whereas FIG. 2 illustrates a Si substrate 20 including a $SiO_2$ layer 21 (or IL layer) formed thereon between the spacers 19. The IL layers of substrates 10 and 20 are different at this point of the process.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

FIG. 3 is a cross-sectional view of the semiconductor device of FIG. 1 where germanium oxide ($GeO_X$) is selectively removed from the $SiGeO_X$, in accordance with an embodiment of the present invention.

Gases 24 are applied to the structure 5 including the SiGe substrate 10. Gases 24 can be a mixture or combination of $H_2$ (hydrogen) and HCl (hydrogen chloride). Application of the gases 24 results in the removal of germanium oxide ($GeO_X$) from the $SiGeO_X$ layer 11 formed thereon between the spacers 19. Since the Ge—O (GeOx) bond is much weaker than both the Si—O (SiOx) and Si—Ge (substrate), the selective removal of GeOx (GeOx-scavenging) occurs.

Removal of the GeOx from the $SiGeO_X$ layer 11 results in the formation of a $SiO_2$ layer 11' over the substrate 10 between the spacers 19. Thus, both structures 5 (FIG. 3) and 7 (FIG. 2) now have a common pure $SiO_2$ layer formed over the substrates 10, 20, respectively, between the spacers 19. The highlighted region 15' illustrates the new $SiO_2$ layer 11' formed over the substrate 10 between the spacers 19. Therefore, removal of the $GeO_X$ results in the first and second interfacial layers consisting of the same chemical compound. Moreover, removal of the $GeO_X$ results in decreased interface trap density in the second interfacial layer and SiGe channel.

The interfacial layer 11' generally has a thickness of from about 0.1 to about 1 nanometer. The interfacial layer 11' provides insulation between the substrate conducting channel and the metal gate (described below), while maintaining desired small dimensions of the device. Although, the thickness of the interfacial layer 11' can generally vary.

The oxidation step can be carried out by any suitable oxidation techniques. Non-limiting examples of oxidation techniques include thermal or chemical oxidation, plasma oxidation, ozonated deionized water treatment, or the like.

After oxidizing the silicon-germanium substrate, a thin interfacial layer is formed on a surface of the silicon-germanium substrate. The resulting thin interfacial layer is comprised of silicon oxide and germanium oxide.

The proportion of germanium oxide in the interfacial layer resulting from the oxidation treatment is highly dependent on the germanium content in the Si1-xGex substrate. The higher the germanium content in the silicon-germanium substrate, the higher the germanium oxide content of the interfacial layer. The lower the germanium content in the silicon-germanium substrate, the lower the germanium oxide content of the interfacial layer.

Germanium oxide is harmful to the quality of the interfacial layer formed on the Si1-xGex channel. The harm to the channel is evidenced by the increase in charged interface states. The harm to the channel is also evidenced by the decrease in mobility with increasing amounts of germanium oxide in the interfacial layer.

Accordingly, described herein are methods to scavenge or remove the germanium oxide from an interfacial layer comprising germanium oxide and silicon oxide that is formed on a silicon-germanium substrate. In some embodiments, the germanium oxide is substantially removed from the interfacial layer, leaving silicon oxide remaining. In other embodiments, after a scavenging step, the residual germanium oxide is less than 10%, for example, less than 1%, by weight of the interfacial layer.

The scavenging step can be carried out by heating the substrate at a temperature of from about 450° C. to about 800° C. in a reducing atmosphere having a hydrogen partial pressure of from about 0.1 Torr to about 15,200 Torr.

Such reduction of the germanium oxide content of the scavenged interfacial layer reduces charged surface interface states. Reduction of the germanium oxide content also enhances mobility in the conducting channel layer of the substrate.

After the scavenging step, the interfacial layer comprises from about 30% to about 50% by weight silicon and from about 50% to about 70% by weight oxygen. The residual germanium does not exceed about 10% by weight, measured as GeO2.

The scavenging step is carried out for a time period of from about 1 to about 15 minutes. For example, the scavenging step can be carried out for about 3 to about 7 minutes.

The scavenging temperature is from about 450° C. to about 800° C. For example, the scavenging temperature can be about 500° C. to about 700° C. Alternatively, the scavenging temperature can be from about 550° C. to about 750° C. The scavenging temperature depends on the germanium content of the substrate.

The scavenging step is effective because the germanium-oxygen bond in germanium oxide is much weaker than both the silicon-oxygen bond in silicon oxide and the silicon-germanium bond in the substrate. Accordingly, germanium oxide is easily removed, leaving silicon oxide remaining within the interfacial layer on the substrate.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

FIG. 4 is a cross-sectional view of the semiconductor device of FIG. 3 where a high-k metal gate (HKMG) is applied, in accordance with an embodiment of the present invention.

A high-k dielectric layer 30 and a metal gate layer 32 are deposited over the ILD 18 and the spacers 19. A fill metal 34 is then applied over the HKMG 30, 32 to complete the structure 35 including the SiGe substrate 10. The highlighted region 31 illustrates a SiO$_2$ layer 11' formed over the substrate 10 between the spacers 19. Region 31 also illustrates the HKMG 30, 32 positioned directly over the SiO$_2$ layer 11'. Region 31 can be referred to as a pFET.

The scavenging step can be carried out prior to or right after the application of a high-k dielectric layer over at least a portion of the interfacial layer. The high-k dielectric layer high-k dielectric material(s) can be a dielectric material having a dielectric constant, for example, greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof.

In various embodiments, the high-k material can include but is not limited to metal oxides such as hafnium oxide (e.g., HfO$_2$), hafnium silicon oxide (e.g., HfSiO$_4$), hafnium silicon oxynitride (Hf$_w$Si$_x$O$_y$N$_z$), lanthanum oxide (e.g., La$_2$O$_3$), lanthanum aluminum oxide (e.g., LaAlO$_3$), zirconium oxide (e.g., ZrO$_2$), zirconium silicon oxide (e.g., ZrSiO$_4$), zirconium silicon oxynitride (Zr$_w$Si$_x$O$_y$N$_z$), tantalum oxide (e.g., TaO$_2$, Ta$_2$O$_5$), titanium oxide (e.g., TiO$_2$), barium strontium titanium oxide (e.g., BaTiO$_3$—SrTiO$_3$), barium titanium oxide (e.g., BaTiO$_3$), strontium titanium oxide (e.g., SrTiO$_3$), yttrium oxide (e.g., Y$_2$O$_3$), aluminum oxide (e.g., Al$_2$O$_3$), lead scandium tantalum oxide (Pb(Sc$_x$Ta$_{1-x}$)O$_3$), and lead zinc niobate (e.g., PbZn$_{1/3}$Nb$_{2/3}$O$_3$). The high-k material can further include dopants such as lanthanum and/or aluminum. The stoichiometry of the high-K compounds can vary.

In various embodiments, the high-k material can have a thickness in the range of about 1.5 nm to about 3 nm.

The high-k dielectric material layer can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material can vary depending on the deposition process as well as the composition and number of high-k dielectric materials used.

In an exemplary embodiment, the high-k dielectric material includes hafnium oxide, hafnium silicate, zirconium oxide, zirconium silicate, alumina and aluminum silicate. In one embodiment, the high-k dielectric layer can have a thickness of up to about 3 nanometers.

FIG. 5 is a cross-sectional view of the semiconductor device of FIG. 2 where a high-k metal gate (HKMG) is applied, in accordance with an embodiment of the present invention.

A high-k dielectric 30 layer and a metal gate layer 32 are deposited over the ILD 18 and the spacers 19. A fill metal 34 is then applied over the HKMG 30, 32 to complete the structure 37 including the Si substrate 20. The highlighted region 33 illustrates a SiO$_2$ layer 21 formed over the substrate 20 between the spacers 19. Region 33 also illustrates the HKMG 30, 32 positioned directly over the SiO$_2$ layer 21. Region 33 can be referred to as an nFET.

Therefore, referring to FIGS. 4 and 5, planar structures 35, 37 are shown for simplicity of demonstration. However, it is contemplated that the exemplary embodiments of the present invention can be applicable to 3D structures, such as, but not limited to, FinFETs, Nanowire FETs, etc. FIG. 4 illustrates a SiGe substrate 10 including a SiO$_2$ layer 11' formed thereon between the spacers 19, whereas FIG. 5 illustrates a Si substrate 20 including a SiO$_2$ layer 21 formed thereon between the spacers 19, as well as a HKMG 30, 32 with metal fill 34 deposited over the structures 35, 37. The SiO$_2$ layer 11' was formed by applying gases, such as H$_2$ and HCl. Thus, both IL layers are common (i.e., include the chemical composition SiO$_2$).

Figure 6:
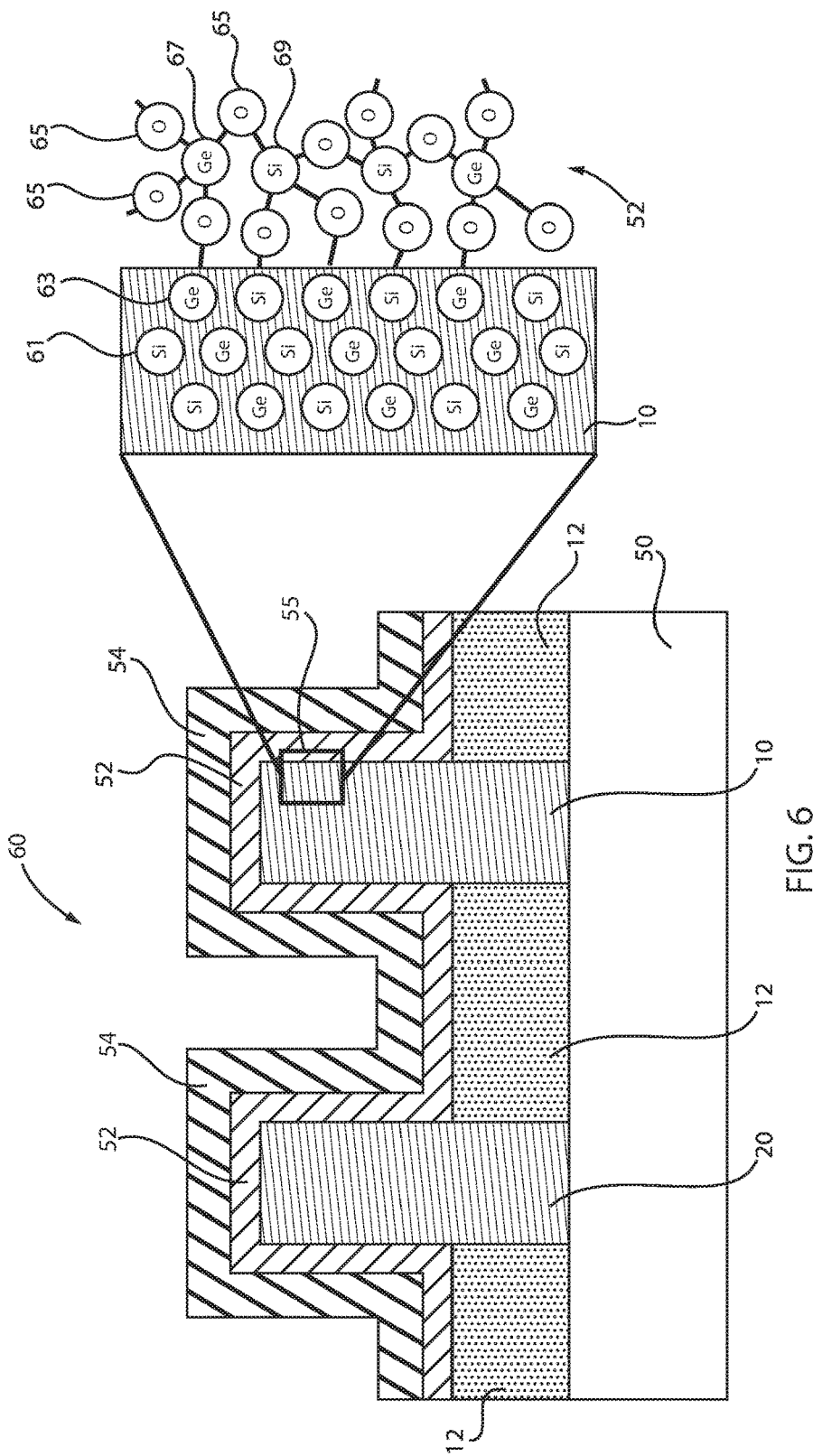
FIG. 6 is a cross-sectional view of a semiconductor device where the structures of FIGS. 4 and 5 are combined on a common substrate, in accordance with an embodiment of the present invention.

FIG. 6 is a cross-sectional view of a semiconductor device where the structures of FIGS. 4 and 5 are combined on a common substrate, in accordance with an embodiment of the present invention.

The structure 60 includes the Si channel 20, which forms the Si nFET, and the SiGe channel 10, which forms the SiGe pFET, on a substrate 50. The substrate 50 can be, e.g., a Si substrate. However, one skilled in the art may contemplate other material substrates. A HKMG is deposited thereon having a dielectric layer 52 and metal gate 54. A highlighted portion 55 is expanded to illustrate the Si elements 61 and the Ge elements 63 within the substrate 10. Additionally, the highlighted portion 55 illustrates high-k dielectric layer 52 depicting bonding between Ge elements 67 and oxygen 65, as well as Si elements 69 and oxygen 65. Thus, highlighted portion 55 depicts the SiGe/SiGeO$_X$ interface. Since the Ge—O (GeOx) bond is much weaker than both the Si—O (SiOx) and Si—Ge (substrate), the selective removal of GeOx (GeOx-scavenging) occurs, as illustrated below with reference to FIG. 7.

Figure 7:
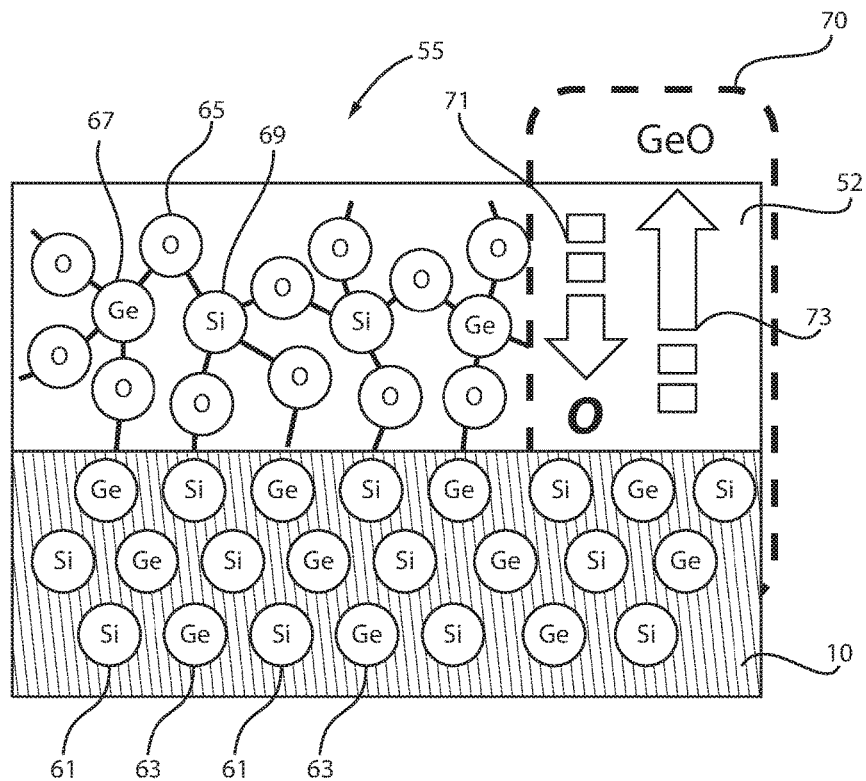
FIG. 7 is a schematic illustrating selective removal of $GeO_X$ from the $SiGeO_X$, in accordance with an embodiment of the present invention.

FIG. 7 is a schematic illustrating selective removal of GeO$_X$ from the SiGeO$_X$, in accordance with an embodiment of the present invention.

In section 70, the GeO (or Vo) diffuses out, as indicated by arrow 73, while O diffuses into the SiGe surface, as indicated by arrow 71, and Si is preferentially oxidized due to the lower Gibbs free energy.

Figure 8:
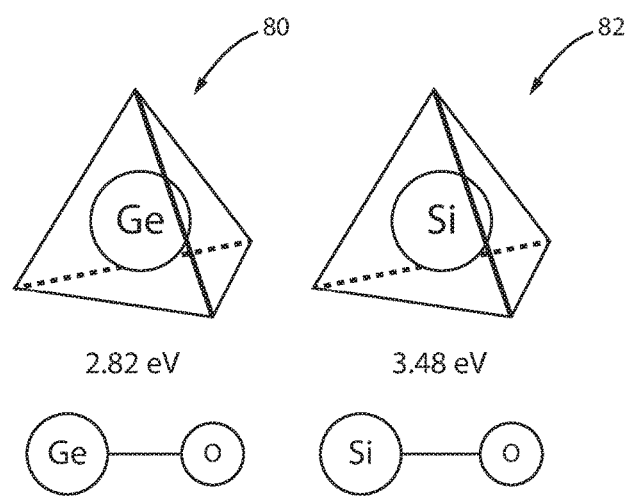
FIG. 8 is a schematic illustrating the binding energies achieved for Si and Ge in the semiconductor structure of FIG. 6, in accordance with an embodiment of the present invention.

FIG. 8 is a schematic illustrating the binding energies achieved for Si and Ge in the semiconductor structure of FIG. 6, in accordance with an embodiment of the present invention.

The binding energy 80 of Ge can be, e.g., about 2.82 eV, whereas the binding energy 82 of Si can be, e.g., about 3.48 eV for the structures 35 and 37 of FIGS. 4 and 5, respectively.

Figure 9:
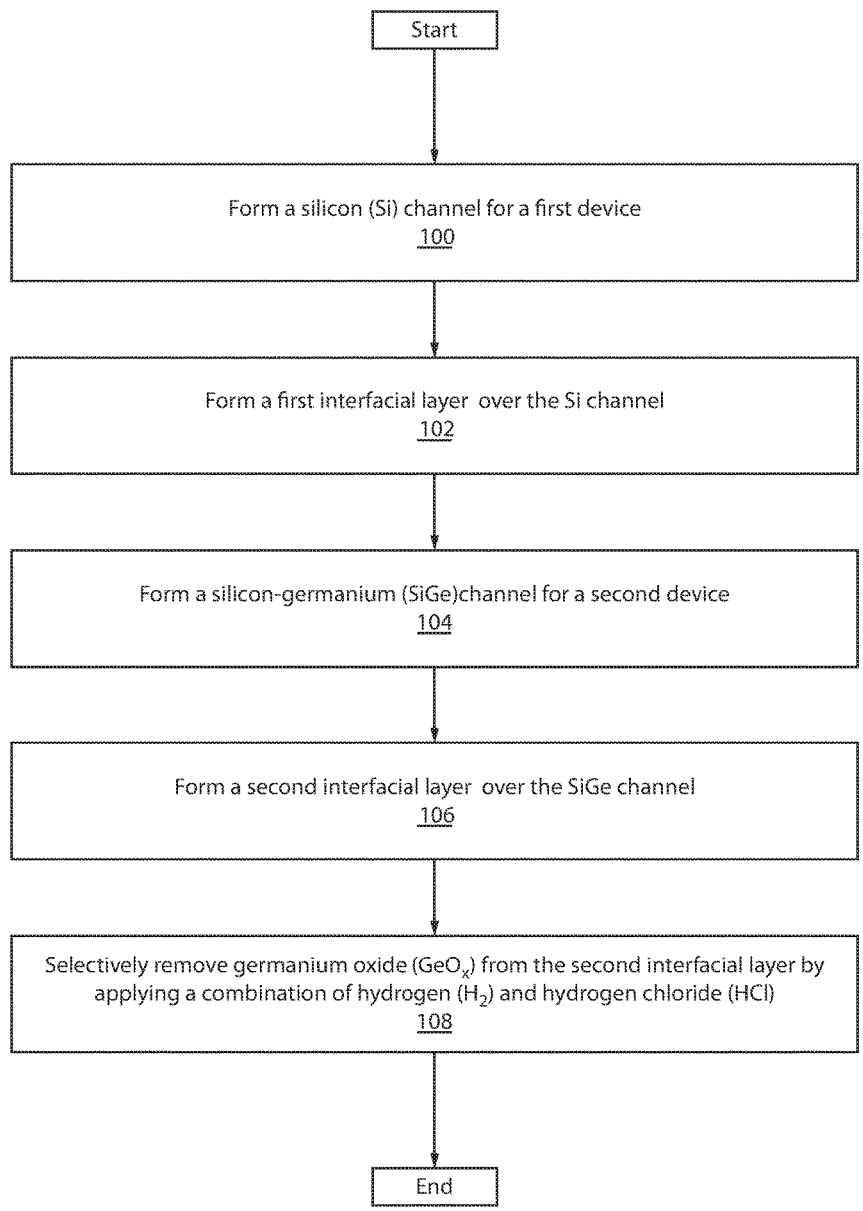
FIG. 9 is a block/flow diagram of an exemplary method for forming a semiconductor device, in accordance with an embodiment of the present invention.

FIG. 9 is a block/flow diagram of an exemplary method for forming a semiconductor device, in accordance with an embodiment of the present invention.

At block 100, form a silicon (Si) channel for a first device.

At block 102, a first interfacial layer is formed over the Si channel.

At block 104, a silicon-germanium (SiGe) channel is formed for a second device.

At block 106, a second interfacial layer is formed over the SiGe channel.

At block 108, the germanium oxide ($GeO_X$) is selectively removed from the second interfacial layer by applying a combination of hydrogen ($H_2$) and hydrogen chloride (HCl).

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated for reducing parasitic back gate capacitance (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor structure, the method comprising:
    forming a first channel for a first device;
    forming a first interfacial layer in direct contact with the first channel;
    forming a second channel for a second device;
    forming a second interfacial layer in direct contact with the second channel, where the first interfacial layer is constructed from a different material than the second interfacial layer; and
    selectively removing germanium oxide ($GeO_X$) from the second interfacial layer by applying a combination of gases to convert the first interfacial layer to have a same chemical compound as the second interfacial layer; and
    depositing a high-k metal gate in direct contact with the converted first interfacial layer.

2. The method of claim 1, wherein the first device is an n-type field effect transistor (nFET).

3. The method of claim 1, wherein the second device is a p-type field effect transistor (pFET).

4. The method of claim 1, wherein the first channel is silicon (Si), the second channel is silicon germanium (SiGe), and the second interfacial is silicon germanium oxide (Si-$GeO_X$).

5. The method of claim 1, wherein removal of the $GeO_X$ results in formation of a pure silicon dioxide ($SiO_2$) layer.

6. The method of claim 1, wherein the converted first interfacial layer is formed between spacers.

7. The method of claim 6, wherein the combination of gases are applied to sidewalls of the spacers before the converted first interfacial layer is formed.

8. The method of claim 1, wherein removal of the $GeO_X$ prevents breaking of Si—O bonds in the second interfacial layer.

9. The method of claim 1, wherein removal of the $GeO_X$ results in decreased interface trap density in the second interfacial and the second channel.

10. The method of claim 1, wherein the gases are a combination of hydrogen ($H_2$) and hydrogen chloride (HCl).

* * * * *